United States Patent [19]
Boer et al.

[11] Patent Number: 5,994,836
[45] Date of Patent: Nov. 30, 1999

[54] ORGANIC LIGHT EMITTING DIODE (OLED) STRUCTURE AND METHOD OF MAKING SAME

[75] Inventors: Willem den Boer, Plymouth; John Z. Z. Zhong, Novi; Scott V. Thomsen, Milford, all of Mich.

[73] Assignee: OIS Optical Imaging Systems, Inc., Northville, Mich.

[21] Appl. No.: 09/017,206

[22] Filed: Feb. 2, 1998

[51] Int. Cl.$^6$ ....................................................... H01J 1/62
[52] U.S. Cl. ............................................. 313/504; 313/506
[58] Field of Search ................................... 313/504, 506, 313/512

[56] References Cited

U.S. PATENT DOCUMENTS 5,151,629  9/1992  Vanslyke .
5,495,224  2/1996  Adar .
5,670,792  9/1997  Utsugi et al. ............................. 313/504
5,693,956  12/1997  Shi et al. .
5,703,436  12/1997  Forrest et al. .
5,707,745  1/1998  Forrest et al. .

*Primary Examiner*—Vip Patel
*Attorney, Agent, or Firm*—Joseph A. Rhoa

[57] ABSTRACT

An organic light emitting diode (OLED) array structure, and corresponding method of making same are provided. Each OLED pixel includes a first electrode on a substrate, a second electrode on a substrate, and an organic emission layer disposed between the first and second electrodes so as to emit visible light when a suitable potential is applied thereto by the electrodes. In accordance with certain embodiments of this invention, a step covering or coverage layer is provided over step or edge areas of the first electrode in order to reduce the structures susceptibility to breakdown at pixel edges thereby improving yields.

16 Claims, 2 Drawing Sheets

ORGANIC LIGHT EMITTING DIODE (OLED) STRUCTURE AND METHOD OF MAKING SAME

This invention relates to an organic light emitting diode (OLED) structure, and a method of making same. More particularly, this invention relates to an OLED structure including a photo-imageable step coverage layer which functions to reduce the structure's susceptibility to breakdown at pixel edges thereby improving yields.

BACKGROUND OF THE INVENTION

Organic light emitting diodes (OLEDs) are useful in a variety of applications including use in watches, telephones, lap-top computers, pagers, cell phones, calculators, and the like. See, for example, U.S. Pat. Nos. 5,693,956; 5,151,629; 5,707,745; and 5,703,436 for conventional OLED devices, the disclosures of which are hereby incorporated herein by reference.

Conventional OLED display structures are built on glass substrates in a manner such that a two-dimensional OLED array for image manifestation is formed. Each OLED in the array generally includes overlying layers starting with a light transmissive first electrode formed on the substrate, an organic electroluminescent (EL) emission medium deposited over the first electrode, and a metallic electrode on top of the organic electroluminescent medium. When an electrical potential is placed across the electrodes, holes and electrons are injected into the organic zones from the anode and cathode, respectively. Light emission results from hole-electron recombination within the device.

Such OLEDs are often manufactured by first depositing the first transparent electrode on the substrate, and patterning same into electrode portions. Each electrode portion, by protruding or sticking up from the substrate, forms steps areas at edges thereof. The organic layer(s) is then deposited over the transparent electrodes and their steps.

Unfortunately, the organic layer(s) is susceptible to breaking down at these step areas, especially in view of the fact that the thickness of the organic layer(s) is often comparable to or thinner than the thickness of the transparent electrode layer. Such breakdown of the organic layer(s) at the step areas during fabrication or operation can cause significant yield loss which is magnified in weak or non-functional lines in the display. The yield loss may be more severe if the edge profile of an electrode at its step area(s) is steep and has sharp edge(s).

It is apparent from the above that there exists a need in the art for an improved OLED structure that is less susceptible to organic layer breakdown at step areas (i.e. at pixel edges), and a corresponding method of making such an OLED structure.

It is a purpose of this invention to fulfill the above-described needs in the art, as well as other needs which will become apparent to the skilled artisan from the following detailed description of this invention.

SUMMARY OF THE INVENTION

Generally speaking, this invention fulfills the above-described needs in the art by providing an organic light emitting diode (OLED) comprising:

a substrate;

a first conductive electrode provided on the substrate, the first electrode defining a step area proximate a first edge thereof;

a step covering layer provided on the substrate over at least a portion of the first electrode so that the step covering layer is located over the step area;

an emission layer of organic material disposed on the substrate;

a second conductive electrode provided on the substrate in a location such that the emission layer of organic material is disposed between the first and second conductive electrodes thereby forming the organic light emitting diode (OLED); and wherein the step covering layer in the step area minimizes the probability of breakdown of the emission layer at the step area.

The emission layer emits visible light when a potential is applied thereacross by the first and second electrodes.

This invention further fulfills the above-described needs in the art by providing a method of making an array of OLEDs, the method comprising the steps of:

providing a substrate;

depositing and patterning a first conductive layer on the substrate so as to form a plurality of first electrode portion;

depositing a step covering layer on the substrate over the first electrode portions;

photoimaging the step covering layer in order to form a plurality of apertures or vias in the step covering layer;

the photoimaging allowing the step covering layer to remain adjacent at least one edge of each first electrode portion in order to cover a step area;

depositing an organic emission layer on the substrate over the step covering layer so that the emission layer contacts the first electrode portions through the apertures or vias; and depositing a second conductive layer and patterning the second conductive layer into a plurality of second electrode portions so that in a plurality of pixel areas on the substrate the emission layer is disposed between one of the first electrode portions and one of the second electrode portions thereby forming the array of OLEDs.

In certain preferred embodiments, the first electrode portions include a plurality of substantially parallel stripes and the second electrode portions also include a plurality of substantially parallel stripes, wherein the first electrode portions are substantially perpendicular to the second electrode portions.

This invention will now be described with reference to certain embodiments thereof as illustrated in the following drawings.

IN THE DRAWINGS

DETAILED DESCRIPTION OF CERTAIN EMBODIMENTS OF THIS INVENTION

Figure 1:
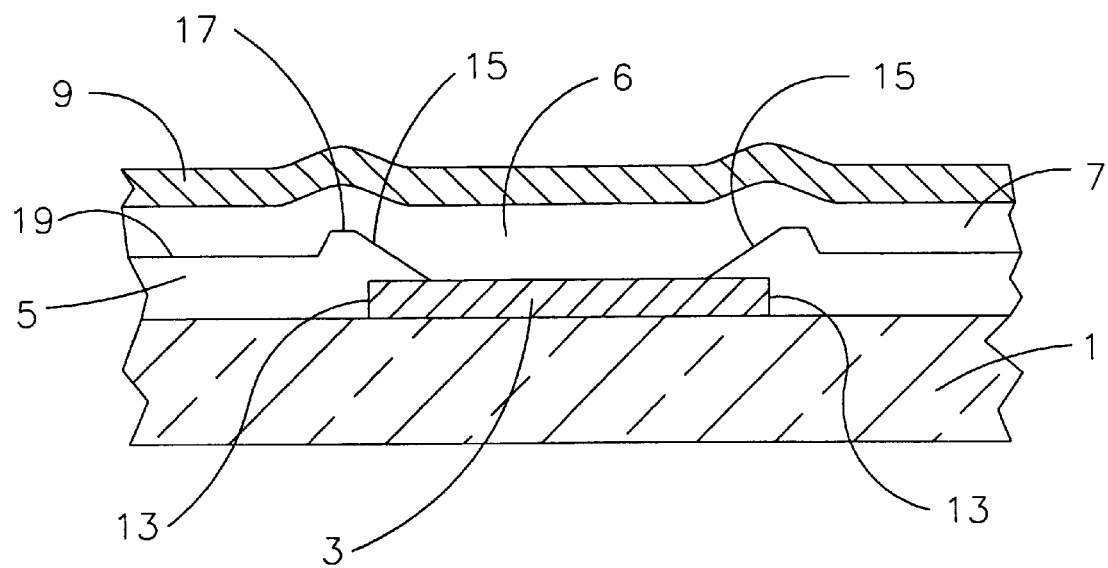
FIG. 1 is a side cross sectional view of a pixel in an OLED device according to an embodiment of this invention.

Referring now more particularly to the accompanying drawings in which like reference numerals indicate like parts throughout the several views.

FIG. 1 is a side cross sectional view of an organic light emitting diode (OLED) pixel according to an embodiment of this invention. This OLED pixel includes substantially transparent substrate 1 (e.g. of glass, plastic, or the like), bottom substantially transparent conductive electrode 3 (e.g. of indium-tin-oxide or ITO), substantially transparent photo-imageable or photodefineable organic step coverage layer 5 including via or aperture 6 defined therein, organic electroluminescent emission layer(s) 7, and top conductive electrode 9 (e.g. formed of a conductive oxide such as ITO). In this embodiment, electrodes 3 and 9 are both patterned in stripes forming rows and columns, respectively, that are aligned perpendicular to one another in order to obtain a matrix array of pixels. In other words, an array of electrodes 3 are formed as parallel stripes of ITO or the like across substrate 1, while an array of electrodes 9 are also formed as parallel stripes of ITO or the like across the substrate, where the electrode 3 stripes are substantially perpendicular to the electrode 9 stripes (see FIG. 3). Bottom electrode 3 in each pixel may also be referred to as the anode while top electrode 9 may be referred to as the cathode. A plurality of the FIG. 1 pixels are arranged on the substrate resulting in the OLED display.

In operation, when the cathode is electrically biased to a negative potential with respect to the anode, holes are injected into the organic hole injecting and transporting zone of layer 7 at its interface with the anode and transported across this zone to a zone junction. Concurrently electrons are injected into the electron injecting and transporting zone of layer 7 at its interface with the cathode, and the injected electrons are transported toward said junction. Recombination of the holes and electrons results in electroluminescence. The hue or the luminescence is determined by the composition of the electron injecting and transporting zone. The light emitted can leave the OLED device in any direction; i.e. through the anode, cathode, and/or edges of the organic medium/layer(s) 7. In preferred embodiments, substantial emission occurs through electrodes 3.

In each pixel (including the pixel shown in FIG. 1), the electrode 3 on substrate 1 includes edges which form step areas 13. The step areas 13 are defined where the top or upper surface of each electrode 3 begins to slope or move toward substrate 1 (e.g. at about 90 degrees as shown in FIG. 1, or at any other angle including angles from about 60–100°). The presence of photo-imageable step coverage layer 5 enables organic emission layer(s) 7 to maintain its integrity at step areas 13 across the edge(s) of electrodes 3. The addition of photo-imageable polymer acrylic layer 5 on substrate 1 at least in the step areas enables the OLED structure to minimize or avoid breakdown at the pixel edges or step areas. Layer 5 can be patterned with sidewall slopes 15 angled relative to the upper surface of electrode 3 at from about 25–65 degrees as shown in FIG. 1 (preferably from about 40–50°, and most preferably about 45°), and with smoothly rounded edges 17. As a result the electric field at the pixel edges is reduced, minimizing the probability of breakdown of the organic layer. This improves the yield of the OLED device. Organic emission layer 7 contacts the upper surface of an electrode 3 in each pixel through a via or aperture 6 defined in the step covering layer 5.

In certain embodiments, step coverage layer 5 is deposited by spin coating or the like on the substrate so that layer 5 is provided directly adjacent the surface of substrate 1 and electrodes 3. Then, the layer is patterned to form vias 6 so that layer 5 remains over only minimal edge portions of electrode 3 adjacent or proximal step areas 13. Alternatively, layer 5 may be deposited on substrate 1 in a manner so that it is not in direct contact with the substrate. As stated above, layer 5 slopes 15 upward from the top surface of electrode 3 in each pixel, at all step areas 13 thereof, at an angle of from about 25–65° until reaching an apex 17 which is smoothly rounded. At apex 17 proximate each step 13, layer 5 slopes back down toward the substrate surface and then levels out substantially into substantially planar portion 19 which extends between pixels.

In certain embodiments, step coverage layer 5 is formed of a photo-imageable organic polymer acrylic such as Fuji Clear™ (available from Fuji), which is an organic mixture including 2-ethoxyethyl acetate (55–70%), methacrylate derivative copolymer (10–20%), and polyfunctional acrylate (10–20%). The 2-ethoxyethyl acetate is a solvent which may not make its way into the final product. Alternatively, layer 5 may be formed of a photo-imageable type of BCB (benzocyclobutene) available form Dow Chemical. In preferred embodiments of this invention, layer 5 has a dielectric constant value of less than about 5.0, and more preferably less than about 3.5. Additionally, electrode layer 3 is at least as thick as emission layer 7.

In certain embodiments, the OLED device of FIG. 1 is manufactured as follows. Substrate 1 is provided. A layer of ITO is deposited and patterned (e.g. mask and etching) on substrate 1 to form the parallel rows of electrode portions 3. Then, a blanket of photo-imageable material is deposited on the substrate over the electrodes 3 by way of spin-coating. This photo-imageable layer may be of a negative resist in certain embodiments so that no additional photoresist is needed to pattern the layer. In order to pattern this layer, the layer is irradiated with ultraviolet (UV) rays (e.g. i rays of about 365 nm), with UV irradiated areas to remain and non-exposed or non-radiated areas of the layer to be removed in developing. A mask may be used. Following exposure of the photo-imageable layer, the layer is developed by using a known developing solution at known concentration to result in step covering layer 5. In developing, the areas of the step coverage layer over central areas of electrodes 3 are removed (i.e. dissolved) thereby forming vias 6 so as to form the step coverage layer 5 shown in FIG. 1. After developing, layer 5 is cured or subjected to postbaking (e.g. about 240 degrees C. for about an hour) to eliminate the solvent so that layer 5 is resinified. Thus, no dry or wet etching is needed to pattern step coverage layer 5. Alternatively, layer 5 may be a positive resist as opposed to a negative resist.

After the step coverage layer 5 has been formed on the substrate over the bottom electrodes 3, the organic luminescent emission layer(s) 7 is deposited in blanket form over substantially the entire substrate 1. Thereafter, top electrode layer is deposited and patterned into substantially parallel strips of electrode portions 9 (see FIGS. 1–3).

Figure 2:
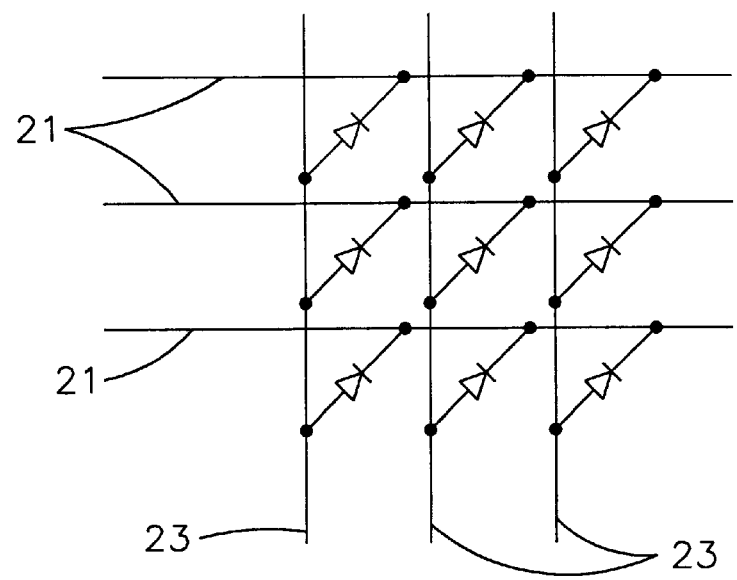
FIG. 2 is a circuit schematic of an array of the FIG. 1 OLED pixels making up an OLED display in accordance with the FIG. 1 embodiment of this invention.

FIG. 2 illustrates an array of the FIG. 1 OLED pixels, including equivalent circuitry thereof. Row address lines 21 (select lines) and column address lines 23 (i.e. data lines) are provided so that different OLED pixels in the array can be selectively addressed or actuated in order to display intended images to viewers.

Figure 3:
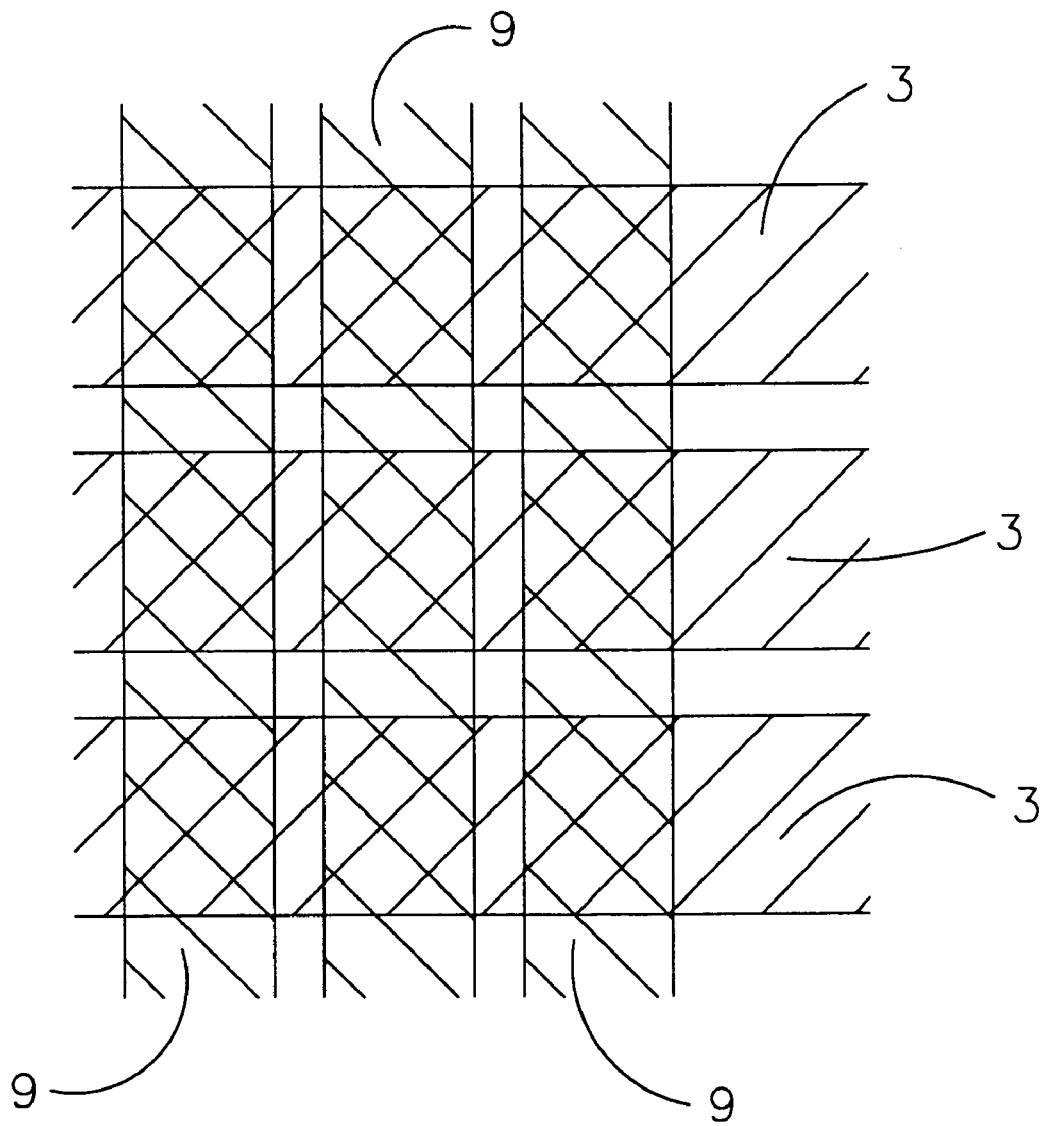
FIG. 3 is a schematic top view illustrating criss crossing top and bottom OLED electrode stripes across the array of FIG. 2.

FIG. 3 is a top view illustrating a plurality of parallel electrode 3 stripes oriented in the row direction, as well as the corresponding plurality of parallel electrode 9 stripes on the substrate in accordance with the FIGS. 1–2 embodiment.

Once given the above disclosure, many other features, modifications, and improvements will become apparent to the skilled artisan. Such other features, modifications, and improvements are therefore considered to be a part of this invention, the scope of which is to be determined by the following claims.

We claim:

1. An organic light emitting diode (OLED) comprising:
a substrate;
a first conductive electrode provided on said substrate, said first electrode defining a step area proximate a first edge thereof;
a step covering layer provided on said substrate over at least a portion of said first electrode so that said step covering layer is located over said step area;
an emission layer of organic material disposed on said substrate;
a second conductive electrode provided on said substrate in a location such that said emission layer of organic material is disposed between said first and second conductive electrodes thereby forming said organic light emitting diode (OLED); and
wherein said step covering layer in said step area minimizes the probability of breakdown of said emission layer at said step area.

2. The OLED of claim 1, wherein said step covering layer is photo-imageable, and has a dielectric constant value of less than about 5.0.

3. The OLED of claim 2, wherein said step covering layer includes a photo-imageable acrylic material.

4. The OLED of claim 3, wherein said step covering layer includes methacrylate derivative copolymer and polyfunctional acrylate.

5. The OLED of claim 3, wherein said step covering layer has a dielectric constant of less than about 3.5.

6. The OLED of claim 1, wherein said step covering layer includes an upper surface that defines an angle of from about 25–65° with an upper surface of said first electrode proximate said step area.

7. The OLED of claim 6, wherein said angle is from about 40–50°.

8. The OLED of claim 6, wherein said upper surface of said first electrode is substantially flat and is substantially horizontally aligned.

9. The OLED of claim 1, wherein said first electrode is substantially transparent to visible wavelengths of light, and said substrate is substantially transparent to visible wavelengths of light.

10. The OLED of claim 1, wherein said step covering layer is an acrylic and is photo-imageable and is photo-imaged by exposure to ultraviolet (UV) radiation.

11. The OLED of claim 1, wherein said step covering layer is a negative resist.

12. The OLED of claim 1, wherein said step area is defined by an edge of said first electrode that forms an angle of from about 60–100° with an upper surface of said substrate.

13. The OLED of claim 12, wherein said angle is about 90°.

14. The OLED of claim 1, further comprising a second step area along another edge of said first electrode and wherein said step covering layer also covers said second step area, and wherein said step covering layer is photo-imaged so as to define a via or aperture therein over a central area of said first electrode so that said emission layer can contact said first electrode through said via or aperture defined in said step covering layer.

15. A method of making an array of organic light emitting diodes (OLEDs), the method comprising the steps of:
providing a substrate;
depositing and patterning a first conductive layer on said substrate so as to form a plurality of first electrode portions;
depositing a step covering layer on said substrate over said first electrode portions;
photo-imaging the step covering layer by exposing the step covering layer to ultraviolet (UV) radiation in order to form a plurality of apertures in said step covering layer, each said aperture being defined over one of said first electrode portions;
said photo-imaging allowing said step covering layer to remain adjacent at least one edge of each said first electrode portion in order to cover a step area;
depositing an organic emission layer on said substrate over said step covering layer so that said emission layer contacts said first electrode portions through said apertures; and
depositing a second conductive layer and patterning the second conductive layer into a plurality of second electrode portions so that in a plurality of pixel areas on the substrate said emission layer is disposed between one of said first electrode portions and one of said second electrode portions thereby forming the array of OLEDs.

16. The method of claim 15, wherein the plurality of first electrode portions includes a plurality of substantially parallel first electrode stripes provided on the substrate, and wherein the plurality of second electrode portions includes a plurality of substantially parallel second electrode stripes on the substrate, and wherein the first electrode stripes are substantially perpendicular to the second electrode stripes so that where the first electrode stripes overlap the second electrode stripes pixels of the OLED display are defined.

* * * * *